United States Patent
Chen et al.

(10) Patent No.: US 9,859,399 B2
(45) Date of Patent: Jan. 2, 2018

(54) LATERAL DIFFUSED SEMICONDUCTOR DEVICE WITH RING FIELD PLATE

(71) Applicant: VANGUARD INTERNATIONAL SEMICONDUCTOR CORPORATION, Hsinchu (TW)

(72) Inventors: Sue-Yi Chen, Hsinchu (TW); Chien-Hsien Song, Kaohsiung (TW); Chih-Jen Huang, Dongshan Township (TW)

(73) Assignee: VANGUARD INTERNATIONAL SEMICONDUCTOR CORPORATION, Hsinchu (TW)

( * ) Notice: Subject to any disclaimer, the term of this patent is extended or adjusted under 35 U.S.C. 154(b) by 288 days.

(21) Appl. No.: 14/072,105

(22) Filed: Nov. 5, 2013

(65) Prior Publication Data
US 2015/0123199 A1    May 7, 2015

(51) Int. Cl.
*H01L 29/66* (2006.01)
*H01L 29/40* (2006.01)
*H01L 29/78* (2006.01)

(52) U.S. Cl.
CPC ...... *H01L 29/66681* (2013.01); *H01L 29/402* (2013.01); *H01L 29/404* (2013.01); *H01L 29/66689* (2013.01); *H01L 29/7816* (2013.01)

(58) Field of Classification Search
CPC .................................................. H01L 29/7823
See application file for complete search history.

(56) References Cited

U.S. PATENT DOCUMENTS

| | | | | |
|---|---|---|---|---|
| 2006/0261375 A1* | 11/2006 | Wahl | ............... | H01L 29/0634 257/213 |
| 2006/0267044 A1* | 11/2006 | Yang | ............... | H01L 29/7823 257/141 |
| 2007/0090454 A1* | 4/2007 | Huang | ............... | H01L 29/0696 257/335 |
| 2008/0070369 A1* | 3/2008 | Chen | ............... | H01L 29/407 438/297 |
| 2008/0203496 A1* | 8/2008 | Takahashi | ......... | H01L 29/7816 257/409 |
| 2013/0093012 A1* | 4/2013 | Zhang | ............... | H01L 29/402 257/335 |
| 2013/0277741 A1* | 10/2013 | Guowei | ............ | H01L 29/402 257/343 |

FOREIGN PATENT DOCUMENTS

TW            201025566 A1      7/2010

* cited by examiner

*Primary Examiner* — Robert Huber
*Assistant Examiner* — J. R. Oakley
(74) *Attorney, Agent, or Firm* — Birch, Stewart, Kolasch & Birch, LLP

(57) ABSTRACT

A lateral diffused semiconductor device is disclosed, including: a substrate; a first isolation and a second isolation comprising at least portions disposed in the substrate to define an active area; a first drift region and a second drift region disposed in the active area, wherein the first drift region is disposed in the second drift region; a gate structure on the substrate; a source region in the first drift region; a drain region in the second drift region; and a ring-shaped field plate on the substrate, wherein the ring-shaped field plate surrounds at least one of the source and the drain region.

15 Claims, 12 Drawing Sheets

LATERAL DIFFUSED SEMICONDUCTOR DEVICE WITH RING FIELD PLATE

BACKGROUND OF THE INVENTION

Field of the Invention

This disclosure generally relates to a semiconductor device, and more particularly, to a lateral diffused MOS transistor (LDMOS).

Description of the Related Art

Power semiconductor devices are widely used in electrical circuits, and laterally diffused metal oxide semiconductors (LDMOS) are commonly used in high-voltage integrated circuits. Laterally diffused metal oxide semiconductors can provide high breakdown voltage, and can be integrated with VLSI devices. Furthermore, bipolar-CMOS-LDMOS, which can be applied with high voltage, is well-developed. With the trends of saving electricity and high speed, a semiconductor device with low on-resistance, which can be applied with high voltage, is required.

BRIEF SUMMARY OF INVENTION

An aspect of the disclosure provides a lateral diffused MOS transistor, comprising: a substrate; a first isolation and a second isolation comprising at least portions disposed in the substrate to define an active area; a first drift region and a second drift region disposed in the active area, wherein the first drift region is disposed in the second drift region; a gate structure on the substrate; a source region in the first drift region; a drain region in the second drift region; and a ring-shaped field plate on the substrate, wherein the ring-shaped field plate surrounds at least one of the source and the drain region.

An aspect of the disclosure provides a method for forming a lateral diffused MOS transistor, comprising: providing a substrate; forming a first isolation and a second isolation to define an active area in the substrate; forming a first drift region in the active area; forming a second drift region on the substrate; forming a gate structure and a ring-shaped plate on the substrate; forming a source region in the second drift region; and forming a drain region in the first drift region, wherein the ring-shaped field plate surrounds at least one of the source and the drain region.

BRIEF DESCRIPTION OF DRAWINGS

The disclosure can be more fully understood by reading the subsequent detailed description and examples with references made to the accompanying drawings, wherein.

DETAILED DESCRIPTION OF INVENTION

It is understood that specific embodiments are provided as examples to teach the broader inventive concept, and one of ordinary skill in the art can easily apply the teaching of the present disclosure to other methods or apparatuses. The following discussion is only used to illustrate the disclosure, not limit the disclosure.

The disclosure forms a ring-shaped field plate in a laterally diffused metal oxide semiconductor (LDMOS), wherein the ring-shaped field plate is applied with a voltage. A first portion of the ring-shaped field plate on an isolation can make a drift region of the LDMOS more smooth to reduce or suspend break down. Due to having a dielectric layer under a second portion of a ring-shaped field plate neighboring a gate structure, the LDMOS can be applied with sufficient high break-down voltage. In addition, because the ring-shaped field plate of the device of the disclosure comprises a low electrical conduction material, such as polysilicon, low on-resistance characteristics can be provided and thus the energy consumption of the device can be reduced.

Figure 1A:
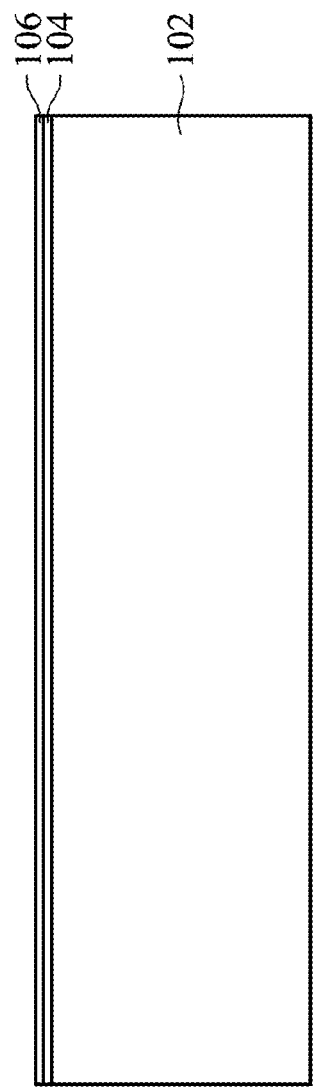
FIG. 1A to FIG. 1J show intermediate stages of cross sections of a method for forming an LDMOS according to some embodiments of the disclosure.

A method for forming a LDMOS of some embodiments of the disclosure is illustrated in accordance with FIG. 1A-FIG. 1J. Referring to FIG. 1A, a substrate 102 suitable for a semiconductor process is provided. The substrate 102 can comprise semiconductor material, such as Si, SiGe, SiC, GaAs or other suitable semiconductor materials. The substrate 102 can comprise an epitaxy layer formed thereon, and the epitaxy layer can be an epitaxy layer of SOI.

Next, a first pad layer 104 and a second pad layer 106 are formed on the substrate 102. In some embodiments, the first pad layer 104 is silicon oxide, and the second pad layer 106 is silicon nitride. The first pad layer 104 can be formed by thermal oxidation, chemical vapor deposition (CVD) or physical vapor deposition (PVD). The second pad layer 106 can be formed by chemical vapor deposition (CVD) or physical vapor deposition (PVD).

Figure 1B:
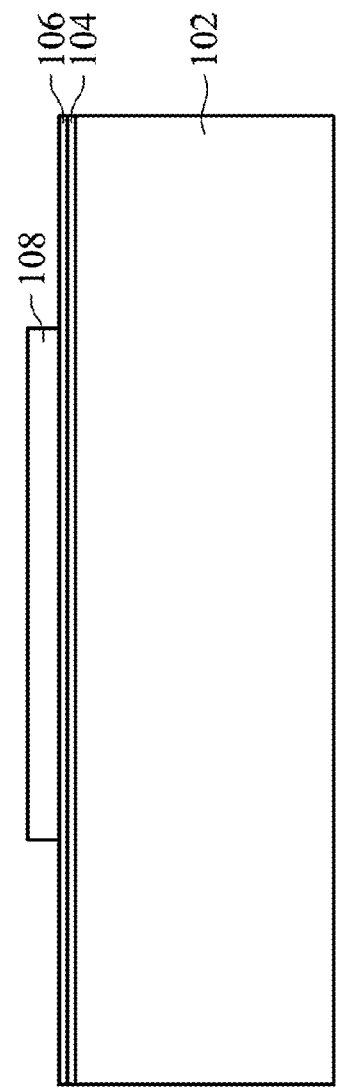
Figure 1C:
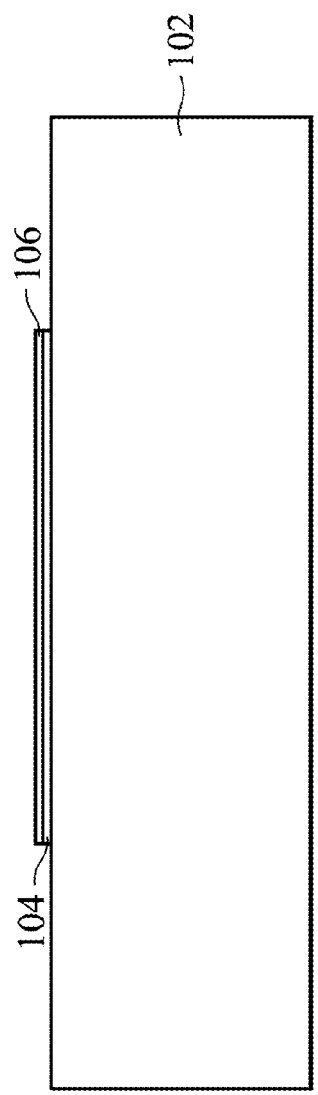

Thereafter, referring to FIG. 1B, a photoresist layer (not shown) is formed on the second pad layer 106. A photolithography process, for example including exposing and developing, is performed to pattern the photoresist layer to form a first patterned photoresist layer 108. Referring to FIG. 1C, an etching process is performed using the first patterned photoresist layer 108 as an etching mask to remove a portion of the first pad layer 104 and the second pad layer 106 not covered by the first patterned photoresist layer 108. Next, the first patterned photoresist layer 108 is removed.

Figure 1D:
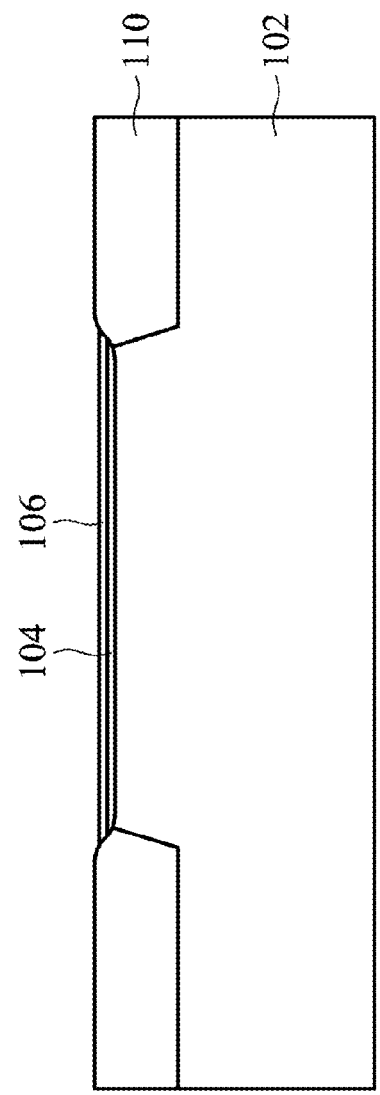

Referring to FIG. 1D, a plurality of isolations 110 are formed in regions of the substrate 102 not covered by the first pad layer 104 and the second pad layer 106, wherein the substrate 102 is defined by the isolations 110 to form active areas (OD). In some embodiments, the isolations 110 can be field oxide. Alternatively, the isolations 110 can be shallow trench isolation (STI). The field oxide can be formed by oxidizing a portion of the substrate 102 not covered by the first pad layer 104 and the second pad layer 106. The STI can be formed by the following steps. An etching process is performed on the substrate 102 to using the first and second pad layers 104, 106 as an etching mask to form trenches. Next, the trenches are filled with insulating material, and the insulating material exceeding the trenches is then removed.

Figure 1E:
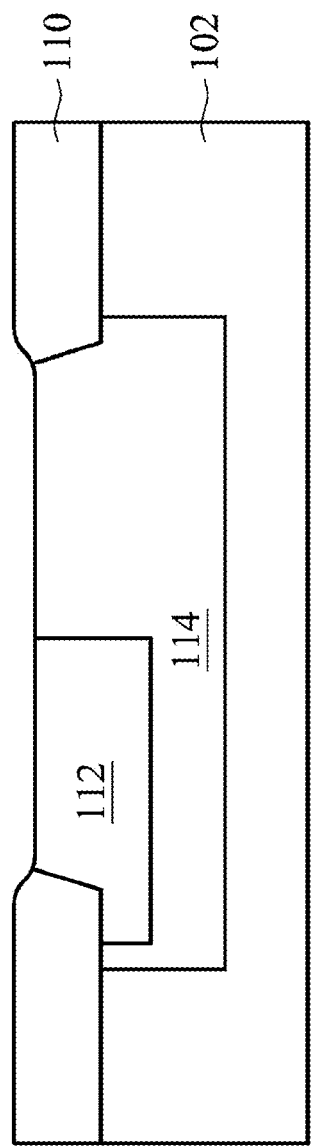

Referring to FIG. 1E, a first ion implantation step is performed to form a first drift region 114 in the active region of the substrate 102. Next, a second ion implantation step is performed to form a second drift region 112 in the active region of the substrate 102. In some embodiments, the second drift region 112 is p type, and the first drift region 114 is n type. When the first drift region 114 is n type, dopants of the first ion implantation can be phosphorous. When the second drift region 112 is p type, dopants of the second ion implantation can be boron. The area of the first drift region 114 can be greater than the area of the second drift region 112. Portions of the second drift region 112 and/or the first drift region 114 can be underlying the isolations 110.

Figure 1F:
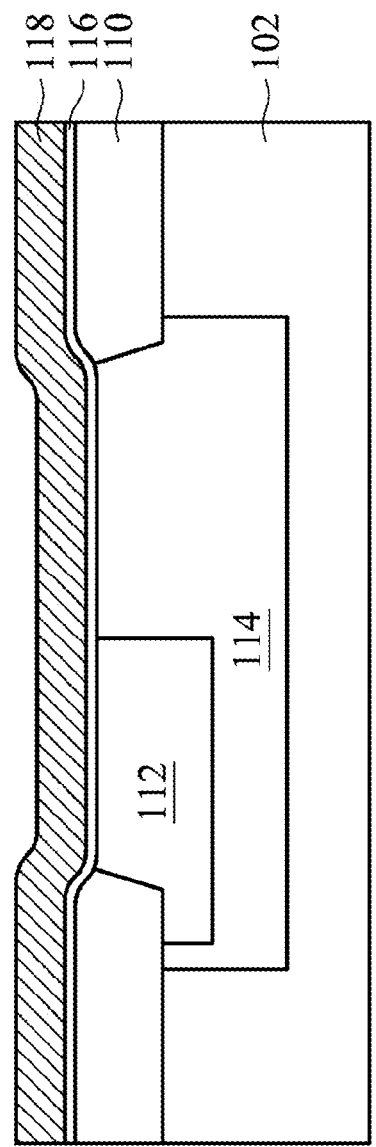

Referring to FIG. 1F, a gate dielectric layer 116 is formed on the substrate 102 and the isolations 110. A conductive layer 118 is formed on the gate dielectric layer 116. In some embodiments, the gate dielectric layer 116 can comprise silicon oxide. Alternatively, the gate dielectric layer 116 can comprise high dielectric constant material, such as $Ta_2O_5$, $HfO_2$, $HSiO_x$, $Al_2O_3$, $InO_2$, $La_2O_3$, $ZrO_2$ or $TaO_2$. The conductive layer 118 can be polysilicon, and can be formed by chemical vapor deposition or an other suitable method. The gate dielectric layer 116 can be formed by thermal oxidation, chemical vapor deposition or other suitable method.

Figure 1G:
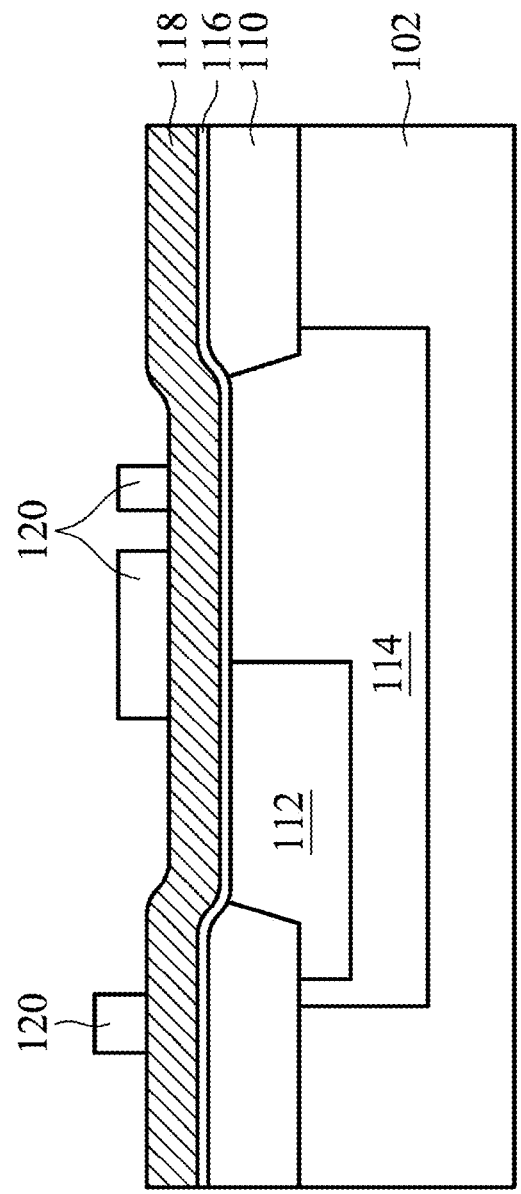
Figure 1H:
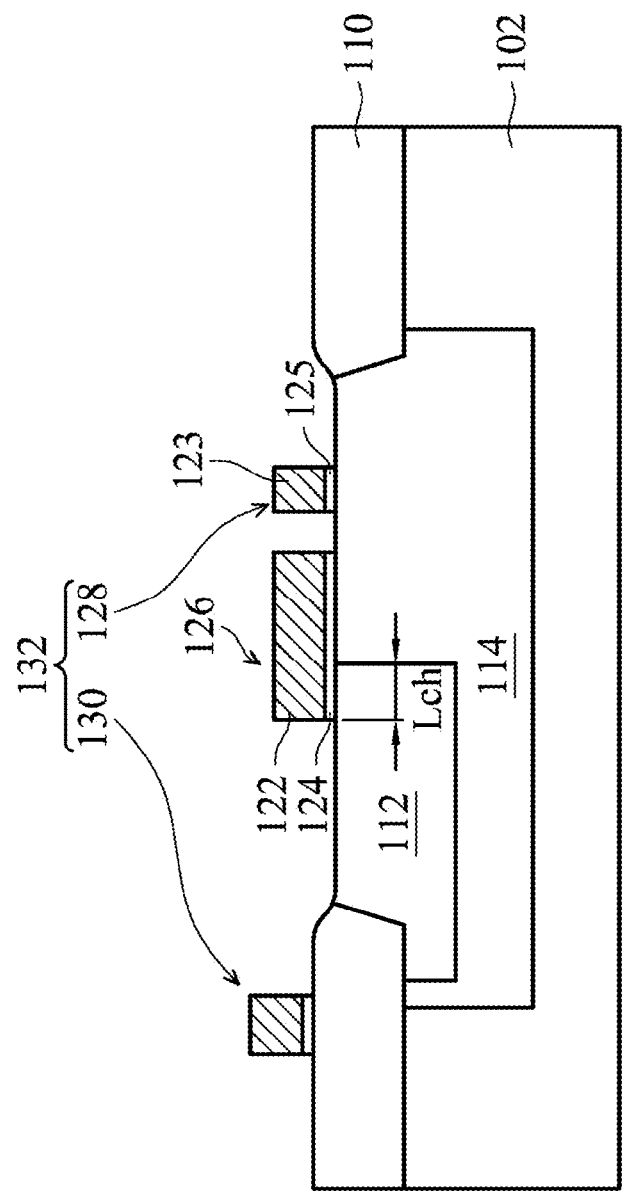

Referring to FIG. 1G, a photoresist layer (not shown) is coated on the conductive layer 118. Next, a photolithography process, for example including exposing and developing, is performed to pattern the photoresist layer to form a second patterned photoresist layer 120. Referring to FIG. 1H, an etching process is performed using the second patterned photoresist layer 120 as an etching mask to form a gate structure 126 and a ring-shaped field plate 132, wherein the ring-shaped field plate 132 comprises a first portion 128 neighboring a first side of the gate structure 126 and a second portion 130 on one of the isolations 110 neighboring a second side of the gate structure 126, wherein the first side is opposite the second side. In some embodiments, the gate structure 126 comprises a gate dielectric layer 124 and a gate electrode layer 122, and the ring-shaped field plate 132 comprises a dielectric layer 125 and a conductive layer 123. In the embodiment, the gate dielectric layer 124 of the gate structure 126 and the dielectric layer 125 of the ring-shaped field plate 132 are formed by the same process step and comprise the same material, such as silicon oxide, silicon nitride or high dielectric constant material. In addition, the gate electrode layer 122 of the gate structure 126 and the conductive layer 123 of the ring-shaped field plate 132 can be formed by the same process step and comprise the same material. It should be noted that, because the ring-shaped field plate 132 and the gate structure 126 are formed by the same process steps, the ring-shaped field plate 132 can be formed without increasing the cost of the device. In some embodiments, as shown in FIG. 1H, the second drift region 112 can extend below the gate structure 126. In one example, the second drift region 112 can extend below the gate structure a distance $L_{ch}$ of about 0.1 μm~30 μm.

Figure 1I:
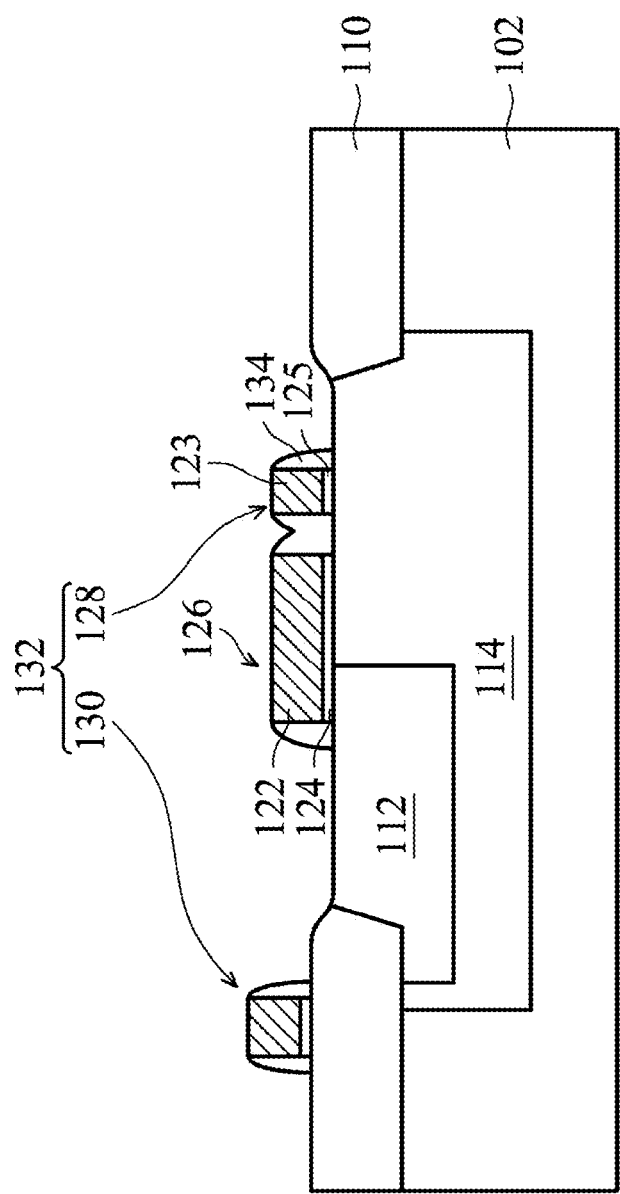

Referring to FIG. 1I, an insulating layer (not shown) is deposited and an etching process is then performed to form spacers 134 on sidewalls of the ring-shaped field plate 132 and the gate structures 126. In some embodiments, the spacer 134 can comprise silicon oxide or silicon nitride, wherein silicon oxide and be formed using tetraethyl orthosilicate (TEOS) as precursor. It is noted that the spacer 134 can be filled into the gap between the first portion 128 of the ring-shaped field plate 132 and the gate structure 126 to prevent introducing dopants into the first drift region 114 under the gap between the first portion 128 of the ring-shaped field plate 132 and the gate structure 126 in the subsequent steps. Therefore, damage to the drift region can be reduced, and the breakdown voltage of the device can thus not be affected.

Figure 1J:
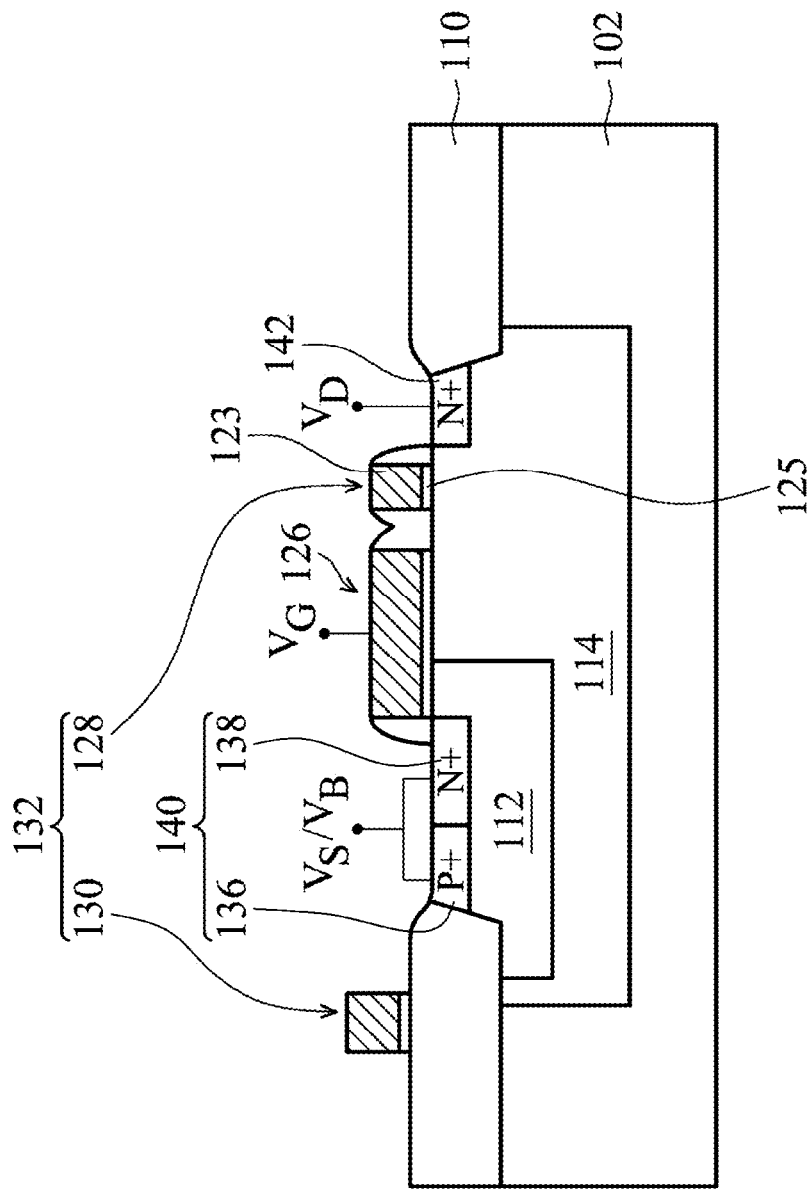

Referring to FIG. 1J, a plurality of ion implantation steps are performed to form a source region 140 neighboring a first side of the gate structure 126 and a drain region 142 neighboring the first portion 128 of the ring-shaped field plate 132 at a second side of the gate structure, wherein the second side is opposite the first side. In some embodiments, the source region 140 comprises a first doping region 136 and a second doping region 138. For example, the first doping region 136 can be p type, the second doping region 138 can be n type, and the drain region 142 can be n type. In some embodiments, the gate structure 126 is applied with gate voltage ($V_G$), the source region 140 is applied with source voltage/base voltage ($V_S/V_B$), and the drain region 142 is applied with drain voltage ($V_D$).

Figure 2:
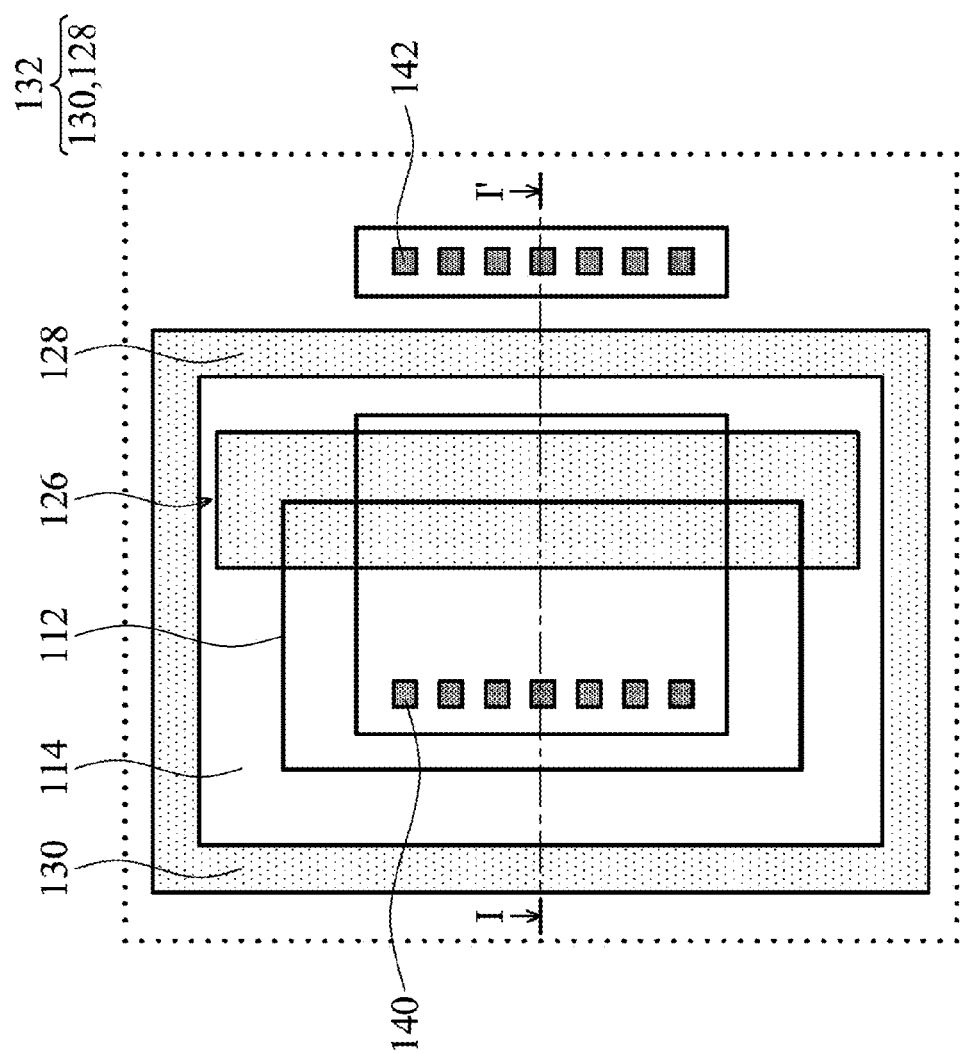
FIG. 2 shows a plane view of an LDMOS according to some embodiments of the disclosure.

FIG. 2 shows a plane view of an LDMOS according to some embodiments of the disclosure, wherein FIG. 1J is a cross section along line I-I' of FIG. 2. As shown in FIG. 2, the ring-shaped field plate 132 surrounds the source region 140 in the present embodiment. The ring-shaped field plate 132 can be applied with a voltage, and the first portion 128 and the second portion 130 of the ring-shaped field plate can have the same electric potential. The second portion 130 of the ring-shaped field plate 132 on the isolations 110 can make the electrical field of the drift regions 112, 114 smoother, so that the assemblage of the electrical field can be prevented to reduce or suspend occurrence of breakdowns. Because the first portion 128 of the ring-shaped field plate 132 neighboring a side of the gate structure 126 has the dielectric layer 125 thereunder, the device can endure sufficient high breakdown voltage. In addition, because the ring-shaped field plate 132 comprises a conductive layer in the present embodiment, low on-resistance characteristics can be provided, so that the energy consumption of the device can be reduced. It is further noted that, because the LDMOS of the embodiment can be applied with a higher breakdown voltage than a conventional device, a larger design tolerance can be provided. For example, it is more flexible to design the size of the drift region.

Figure 3:
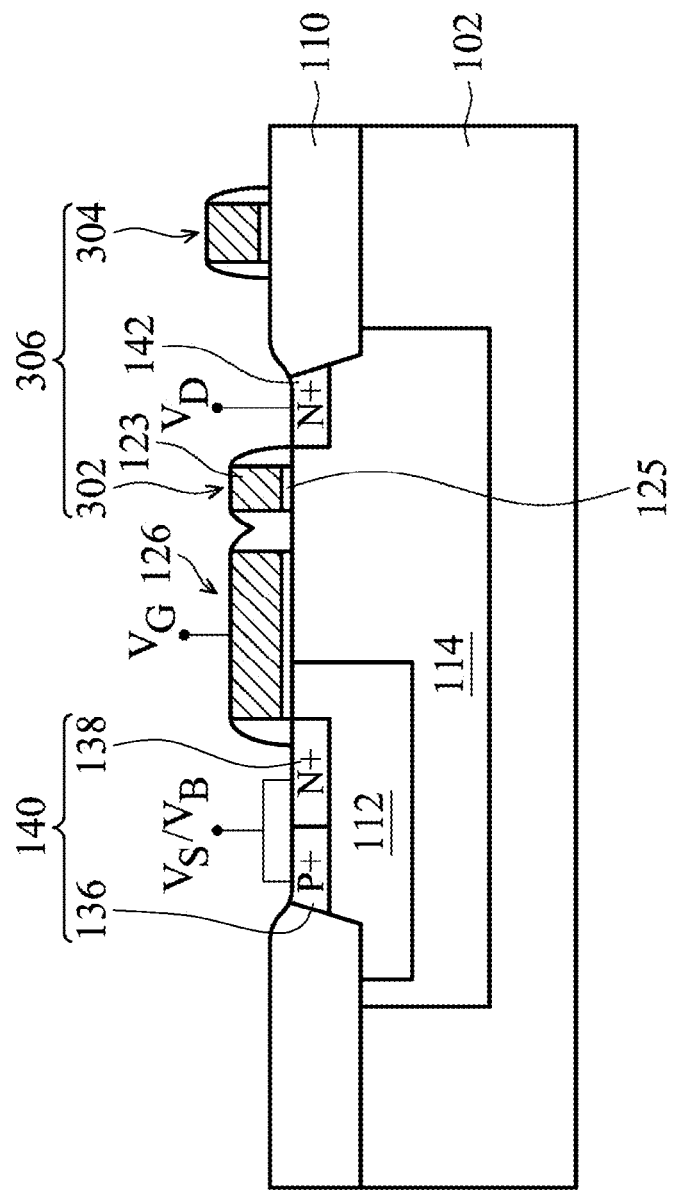
FIG. 3 shows a cross section of an LDMOS according to some embodiments of the disclosure.
Figure 4:
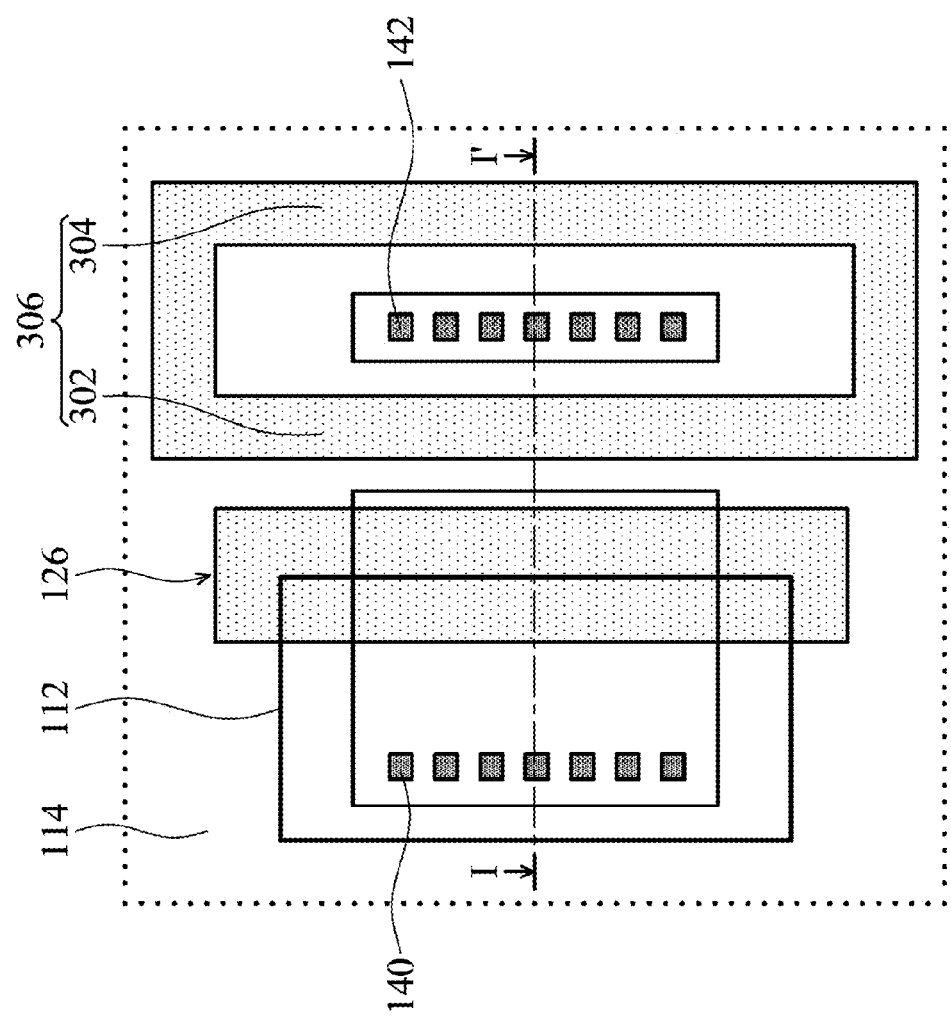
FIG. 4 shows a plane view of an LDMOS according to some embodiments of the disclosure.

FIG. 3 shows a cross section of LDMOS of some embodiments of the disclosure. FIG. 4 shows a plane view of LDMOS of the present embodiment, wherein FIG. 3 is a cross section along line I-I' of FIG. 4. The LDMOS in FIG. 3 and FIG. 4 is similar to the LDMOS in FIG. 1J and FIG. 2, except that the LDMOS in FIG. 3 and FIG. 4 discloses a ring-shaped field plate surrounding the drain region, but the LDMOS in FIG. 1J and FIG. 2 discloses a ring-shaped field plate surrounding the source region. For conciseness, the same part is not described again.

As shown in FIG. 3 and FIG. 4, the ring-shaped field plate 306 surrounds the drain region 142 in the present embodiment. The ring-shaped field plate 306 includes a first portion 302 neighboring a first side of the gate structure 126 and a second portion 304 on the isolation 110 neighboring the first side of the gate structure 126. The present embodiment can also apply a voltage to the first portion 302 and the second portion 304 of the ring-shaped field plate 306, and the first portion 302 has the same electric potential as the second portion 304.

The second portion 304 of the ring-shaped field plate 306 on the isolation 110 can make the electrical field of the drift region 112, 114 smoother, so that the assemblage of the electrical field can be prevented to reduce or suspend occurrence of breakdowns. Because the first portion 302 of the ring-shaped field plate 306 neighboring a side of the gate structure 126 has the dielectric layer 125 thereunder, the device can endure sufficient high breakdown voltage. In addition, because the ring-shaped field plate 306 comprises a conductive layer in the present embodiment, low on-resistance characteristics can be provided, and the energy consumption of the device can be reduced.

The method for forming the LDMOS in FIG. 3 and FIG. 4 is similar to that for forming LDMOS in FIG. 1J and FIG. 2, except that the method for forming the LDMOS in FIG. 3 and FIG. 4 has different photo masks from that in FIG. 1J and FIG. 2 in the lithography process. The method for forming the LDMOS in FIG. 3 and FIG. 4 can refer to that disclosed in FIG. 1J and FIG. 2, so that the details of the process are not described herein.

Figure 5:
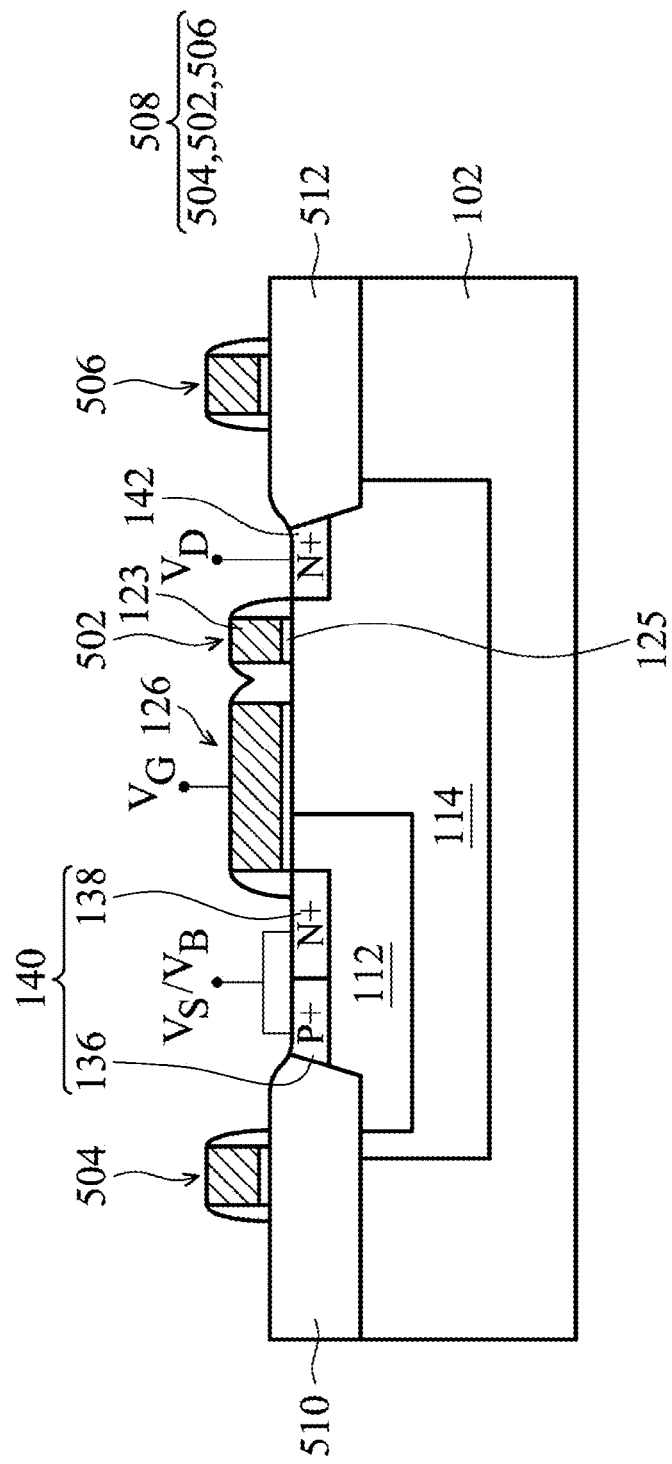
FIG. 5 shows a cross section of an LDMOS according to some embodiments of the disclosure.
Figure 6:
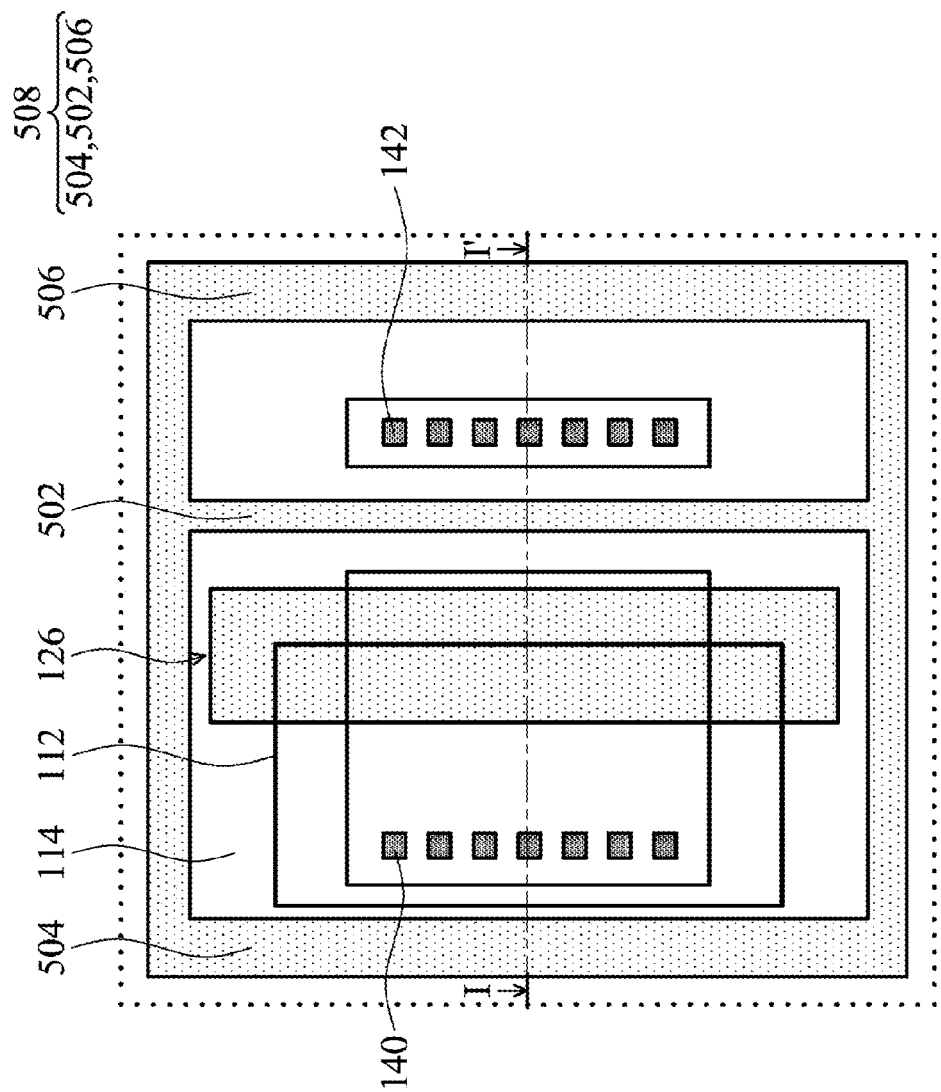
FIG. 6 shows a plane view of an LDMOS according to some embodiments of the disclosure.

FIG. 5 shows a cross section of LDMOS of some embodiments of the disclosure. FIG. 6 shows a plane view of LDMOS of the present embodiment, wherein FIG. 6 is a cross section along line I-I' of FIG. 5. The LDMOS in FIG. 5 and FIG. 6 is similar to the LDMOS in FIG. 1J and FIG. 2, except that the LDMOS in FIG. 5 and FIG. 6 discloses ring-shaped field plate surrounding the source region and the drain region, but the LDMOS in FIG. 1J and FIG. 2 discloses ring-shaped field plate surrounding the source region. For conciseness, the same part is not described again.

As shown in FIG. 5 and FIG. 6, the ring-shaped field plate 508 surrounds the source region 140 and the drain region 142 in the present embodiment. The ring-shaped field plate 508 includes a first portion 502 neighboring a first side of the gate structure 126, a second portion 504 on the isolation 510 neighboring a second side of the gate structure 126, and a third portion 506 on the isolation 512 neighboring the first side of the gate structure 126, wherein the first side is opposite to the second side. The present embodiment can apply a voltage to the first portion 502, the second portion 504 and the third portion 506 of the field plate, and the first portion 502, the second portion 504 and the third portion 506 have the same electric potential.

The second portion 504 and the third portion 506 of the ring-shaped field plate 508 can make electrical field of the drift region 112, 114 smoother, so that assemblage of electrical field can be prevented to reduce or suspend occurring of breakdown. Because the first portion 502 of the ring-shaped field plate 508 neighboring a side of the gate structure 126 has the dielectric layer 125 thereunder, the device can endure sufficient high breakdown voltage. In addition, because the ring-shaped field plate 508 comprises a conductive layer in the present embodiment, low on-resistance characteristic can be provided, and energy consumption of the device can be reduced.

While the invention has been described by way of example and in terms of the preferred embodiments, it is to be understood that the invention is not limited to the disclosed embodiments. It is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A lateral diffused semiconductor device, comprising:
   a substrate;
   a first isolation and a second isolation comprising at least portions disposed in the substrate to define an active area;
   a first drift region and a second drift region disposed in the active area, wherein the second drift region is disposed in the first drift region;
   a gate structure on the substrate;
   a source region of a transistor in the second drift region;
   a drain region of a transistor in the first drift region; and
   a continuous double-ring field plate on the substrate, wherein the continuous double-ring field plate fully surrounds the source region and the drain region, and comprises a first portion between the source region and the drain region of the same transistor.

2. The lateral diffused semiconductor device as claimed in claim 1, wherein the continuous double-ring field plate comprises a dielectric layer and a conductive layer on the dielectric layer.

3. The lateral diffused semiconductor device as claimed in claim 2, wherein the gate structure comprises a gate dielectric layer and a gate electrode layer, the dielectric layer and the gate dielectric layer comprise the same material, and the gate electrode layer and the conductive layer comprise the same material.

4. The lateral diffused semiconductor device as claimed in claim 3, wherein the dielectric layer and the gate dielectric layer comprise $SiO_2$, $Si_3N_4$, $Ta_2O_5$, $HfO_2$, $HSiO_x$, $Al_2O_3$, $InO_2$, $La_2O_3$, $ZrO_2$ or $TaO_2$.

5. The lateral diffused semiconductor device as claimed in claim 1, wherein the continuous double-ring field plate further comprises a second portion, the first portion neighbors a first side of the gate structure, the second portion is disposed on the first isolation, and the first isolation neighbors a second side of the gate structure, wherein the second side is opposite to the first side.

6. The lateral diffused semiconductor device as claimed in claim 5, wherein the first portion and the second portion have the same electric potential.

7. The lateral diffused semiconductor device as claimed in claim 1, wherein the continuous double-ring field plate further comprises a second portion and a third portion, the first portion neighbors the gate structure, the second portion is disposed on the first isolation, and the third portion is disposed on the second isolation.

8. The lateral diffused semiconductor device as claimed in claim 7, wherein the first portion, the second portion and the third portion have the same electric potential.

9. The lateral diffused semiconductor device as claimed in claim 1, further comprising a spacer on opposite sides of the gate structure, wherein the first portion of the continuous double-ring field plate neighbors the gate structure, and the spacer is filled into a gap between the gate structure and the first portion of the continuous double-ring field plate.

10. The lateral diffused semiconductor device as claimed in claim 1, wherein the second drift region is p type, and the first drift region is n type.

11. The lateral diffused semiconductor device as claimed in claim 10, wherein the source region comprises a first doping region and a second doping region, the first doping region is p type, the second doping region is n type, and the drain region is n type.

12. A method for forming a lateral diffused semiconductor device, comprising:
   providing a substrate;
   forming a first isolation and a second isolation to define an active area in the substrate;
   forming a first drift region in the active area;
   forming a second drift region in the substrate;
   forming a gate structure and a continuous double-ring field plate on the substrate;
   forming a source region of a transistor in the second drift region; and
   forming a drain region of the transistor in the first drift region, wherein the continuous double-ring field plate fully surrounds the source region and the drain region, and comprises a first portion between the source region and the drain region of the same transistor.

13. The method for forming a lateral diffused semiconductor device as claimed in claim 12, wherein the gate structure comprises a gate dielectric layer and a gate electrode layer on the gate dielectric layer, the continuous double-ring field plate comprises a dielectric layer and a conductive layer on the dielectric layer, the gate dielectric layer and the dielectric layer comprise the same material and are formed by the same process step, and the gate electrode layer and the conductive layer comprise the same material and are formed by the same process step.

14. The method for forming a lateral diffused semiconductor device as claimed in claim 12, wherein the source region comprises a first doping region and a second doping region, the first doping region is p type, and the second doping region is n type.

15. The method for forming a lateral diffused semiconductor device as claimed in claim 12, further comprising forming a spacer on opposite sides of the gate structure, wherein the first portion of the continuous double-ring field plate neighbors the gate structure, and the spacer is filled into a gap between the gate structure and the first portion of the continuous double-ring field plate.

* * * * *